(12) United States Patent
Wu et al.

(10) Patent No.: US 12,381,316 B2
(45) Date of Patent: *Aug. 5, 2025

(54) FREQUENCY TUNABLE BI-DIRECTIONAL ACTIVE PHASED-ARRAY PROCESSING

(71) Applicant: Tubis Technology Inc., Pasadena, CA (US)

(72) Inventors: Kenny Kun-Long Wu, Pasadena, CA (US); James June-Ming Wang, Pasadena, CA (US)

(73) Assignee: Tubis Technology Inc., San Diego, CA (US)

( * ) Notice: Subject to any disclaimer, the term of this patent is extended or adjusted under 35 U.S.C. 154(b) by 1450 days.

This patent is subject to a terminal disclaimer.

(21) Appl. No.: 16/891,254

(22) Filed: Jun. 3, 2020

(65) Prior Publication Data
US 2024/0405424 A1 Dec. 5, 2024

Related U.S. Application Data

(60) Provisional application No. 62/871,271, filed on Jul. 8, 2019.

(51) Int. Cl.
| | | |
|---|---|---|
| *H01Q 3/26* | (2006.01) | |
| *H01Q 3/30* | (2006.01) | |
| *H03F 3/45* | (2006.01) | |

(52) U.S. Cl.
CPC ............ *H01Q 3/2694* (2013.01); *H01Q 3/30* (2013.01); *H03F 3/45* (2013.01)

(58) Field of Classification Search
CPC .......... H01Q 3/2694; H01Q 3/30; H01Q 3/28; H01Q 3/36; H03F 3/45; H03F 3/245; H03F 2200/451; H04B 1/40; H04B 1/3827; H04B 1/16; H04B 1/12; H04B 1/50; H04B 1/001; H04B 1/44; H04B 1/0053; H04B 2001/0491; H04B 1/18; H04B 1/04; H04B 1/0458; H04B 1/48; H03H 7/38; H03H 11/20; H01P 1/18; H01P 5/16; H03C 5/00; H03C 3/38

See application file for complete search history.

(56) References Cited

U.S. PATENT DOCUMENTS

| | | | |
|---|---|---|---|
| 6,417,712 B1* | 7/2002 | Beards ..................... | H03C 3/38 |
| 11,063,355 B2* | 7/2021 | Wu ........................ | H04B 1/44 |
| 2020/0099350 A1* | 3/2020 | Dani ....................... | H04B 1/04 |
| 2024/0162921 A1* | 5/2024 | Chakraborty ........... | H04B 1/12 |
| 2025/0055171 A1* | 2/2025 | Staudinger .............. | H01P 5/16 |

* cited by examiner

*Primary Examiner* — Lana N Le
(74) *Attorney, Agent, or Firm* — Helen Mao; Zheng Jin; Imperium Patent Works

(57) ABSTRACT

A novel frequency tunable bi-directional phased array processing consisting of variable phase shifting and amplitude adjustment which employs a vector modulator and active combiner and splitter is proposed. Advantages of the proposed bi-directional a phased array processing includes the following 1) compact size; 2) high efficiency; 3) reduced passive trace loss and power consumption; 4) active current combining; 5) high input-output isolation; 6) high resolution and precise gain control and unequal combining or splitting; 7) phase-invariant amplifier design; 8) high accuracy and high-resolution phase shifter; 9) frequency tunability, within a small frequency range and/or a large frequency range; and 10) optimal unequal combining or splitting.

10 Claims, 13 Drawing Sheets

| Main $G_m$ | LSB Step=2 | | | | | |
|---|---|---|---|---|---|---|
| $G_{m,main}$ | $B_0 \cdot G_{m,0}$ | $B_1 \cdot G_{m,1}$ | $B_2 \cdot G_{m,2}$ | $B_3 \cdot G_{m,3}$ | $B_4 \cdot G_{m,4}$ | $B_5 \cdot G_{m,5}$ |
| 50 | ±1 | ±2 | ±4 | ±8 | ±16 | ±19 |

370

| $\Theta$ (degree) | $\alpha$ = Cos(theta)x100 | $\beta$ = Sin(theta)x100 | Transconductance for $\alpha$, $\beta$ ($G_{m,total}$) | Synthesized phase = $\tan^{-1}(\beta/\alpha)$ (degree) | Synthesized magnitude = $\sqrt{\alpha^2+\beta^2}$ | Phase error = \|Synthesized phase - $\Theta$\|² (degree²) | Gain error= [20log(Synthesized magnitude/100)]² (dB²) |
|---|---|---|---|---|---|---|---|
| 0.000 | 100 | 0 | 100, 0 | 0 | 100 | 0.000 | 0 |
| 5.625 | 99.51847267 | 9.801714033 | 100, 10 | 5.710593137 | 100.4987562 | 0.007 | 0.001867427 |
| 11.250 | 98.07852804 | 19.5090322 | 98, 20 | 11.53462065 | 100.019998 | 0.081 | 3.01658E -06 |
| 16.875 | 95.69403357 | 29.02846773 | 96, 28 | 17.35402464 | 100.5783277 | 0.229 | 0.002508828 |
| 22.500 | 92.38795325 | 38.26834324 | 92, 38 | 22.44275337 | 99.53893711 | 0.003 | 0.001611221 |
| 28.125 | 88.19212643 | 47.13967368 | 88, 46 | 27.59729587 | 99.2975327 | 0.278 | 0.003749217 |
| 33.750 | 83.14696123 | 55.5570233 | 82, 56 | 34.3302172 | 99.2975327 | 0.337 | 0.003749217 |
| 39.375 | 77.30104534 | 63.43932842 | 76, 64 | 40.10090755 | 99.35793879 | 0.527 | 0.003130238 |
| 45.000 | 70.71067812 | 70.71067812 | 70, 70 | 45 | 98.99494937 | 0.000 | 0.007698175 |
| 50.625 | 63.43932842 | 77.30104534 | 64, 76 | 49.89909245 | 99.35793879 | 0.527 | 0.003130238 |
| 56.250 | 55.5570233 | 83.14696123 | 56, 82 | 55.6697828 | 99.2975327 | 0.337 | 0.003749217 |
| 61.875 | 47.13967368 | 88.19212643 | 46, 88 | 62.40270413 | 99.2975327 | 0.278 | 0.003749217 |
| 67.500 | 38.26834324 | 92.38795325 | 38, 92 | 67.55724663 | 99.53893711 | 0.003 | 0.001611221 |
| 73.125 | 29.02846773 | 95.69403357 | 28, 96 | 72.64597536 | 100.5783277 | 0.229 | 0.002508828 |
| 78.750 | 19.5090322 | 98.07852804 | 20, 98 | 78.46537935 | 100.019998 | 0.081 | 3.01658E06 |
| 84.375 | 9.801714033 | 99.51847267 | 10, 100 | 84.28940686 | 100.4987562 | 0.007 | 0.001867427 |
| 90.000 | 0 | 100 | 0, 100 | 90 | 100 | 0.000 | 0 |
| | | | | | | RMS phase error (degree) | RMS gain error (dB) |
| | | | | | | 0.427659662 | 0.05058193 |

INVERTIBLE POLARITY SWITCH

FREQ TUNABLE QUADRATURE
PHASE COUPLER

FREQUENCY TUNABLE BI-DIRECTIONAL ACTIVE PHASED-ARRAY PROCESSING

CROSS REFERENCE TO RELATED APPLICATIONS

This application claims priority under 35 U.S.C. § 119 from U.S. Provisional Application No. 62/871,271, entitled "Frequency Tunable Bi-Directional Active Phased-Array Processing," filed on Jul. 8, 2019, the subject matter of which is incorporated herein by reference.

TECHNICAL FIELD

The disclosed embodiments relate generally to wireless network communications, and, more particularly, to wideband Bi-directional active phased array processing.

BACKGROUND

The bandwidth shortage increasingly experienced by mobile carriers has motivated the exploration of the under-utilized Millimeter Wave (mmWave) frequency spectrum around 24 G and 300 G Hz for the next generation 5G broadband cellular communication networks. The available spectrum of mmWave band is hundreds of times greater than the conventional cellular system. The mmWave wireless network uses directional communications with narrow beams and can support multi-gigabit data rate. The under-utilized bandwidth of the mmWave spectrum has wavelengths ranging from 1 mm to 20 mm. The very small wavelengths of the mmWave spectrum enable large number of miniaturized antennas to be placed in a small area. Such miniaturized antenna system can produce high beamforming gains through electrically steerable arrays generating directional transmissions which can be dynamically steered toward user direction. To support the directional communications with narrow beams in mmWave networks, a 5G base station typically supports one or multiple beams with phased-array antenna(s).

Currently, the worldwide mmWave spectrum is not heavily used. As a result, governments around the world allocate multiple mmWave spectrum bands, each with substantial bandwidth, for the mobile cellular usage to encourage the industry to develop commercially feasible technology for various applications and usage case scenarios and to stimulate the growth in economy and technology. 3GPP, a worldwise cellular standard development party, defines several frequency bands (n257 26.50 to 29.50 GHz, n258 24.25 to 27.50 GHz, n260 37.00 to 40.00 GHz, n261 27.50-28.35 GHz, and n259. 39.5 to 43.5 GHz. In United States, a cellular service provider can obtain license(s) to operate at specific frequencies at different locations through bidding on public auctions held by the federal government. As a result, one important aspect for a phased-array antenna design to support different frequencies is to enable frequency tunability within a wide bandwidth of a specific band (i.e., frequency tunable within the band) and also be able to switch to different frequency bands (i.e., frequency tunable to a different band). For a mobile device perspective, the frequency tunability allows it to roam to different service areas and adjust to the frequency used by the cellular base stations. From a cellular base station perspective, the frequency tunability allows the same type of phased-array antenna to be used at different frequencies and bands and simplifies the logistics of equipment supply and maintenance.

In antenna theory, a phased antenna array usually means an array of antennas that creates a beam of radio waves can be electronically steered to points in different directions, without moving the antennas. In a phased antenna array, a radio frequency signal from the transmitter is fed to individual antennas with the correct amplitude and phase relationship so that the radio waves from separate antennas add coherently together to increase the radiation in a desired direction, and with desired antenna beam pattern which, e.g., suppressing radiation in the undesired directions. The steering of the beam direction is achieved by establishing the relative phase relationship (each set of relative phases corresponding to a specific beam direction) between signals from different antennas within the phased array antenna. For a given beam direction, the shape of antenna beam (sidelobes) can be controlled by establishing the relative amplitude relationship (tapering) between signals from different antennas within the phased array antenna. In a TX antenna array, the power from the transmitter is divided up first and each is fed to an antenna through a phase shifter and variable gain amplifier, controlled by a processor, which can alter the signal phase and amplitude electronically, thus steering and shaping the antenna beam of radio waves to a desired direction. In a RX antenna array, the received signals from the antennas, each is fed through a phase shifter and a variable gain amplifier, controlled by a processor, which can alter the signal phase and amplitude electronically, are combined into a signal, thus steering and shaping the beam of radio waves.

For a Time-Division Duplexing (TDD) beamforming integrated circuit (IC), the conventional approach is to use separate TX and RX paths, with high performance and easier design, but at the cost of large die area, complex routing, cross-coupling, and lossy. The industrial approach for TDD Phased-Array Antenna involves using active circuit block containing TX amplifier and RX amplifier and transmit and receive switches at both the input and output of the amplifiers and shared routing and passive blocks (such as phase shifter). The industrial approach reduces routing, cross-coupling, and die area, but the input and output switches are lossy and the die area is still large. Bidirectional amplifier with shared routing and passive blocks to TX and RX signal direction have been proposed to achieve smaller die area, simplified routing, reduced coupling, and lower loss (no loss in input and output switches). However, bidirectional amplifier is difficult to design.

Conventional realization of amplification in TX and RX signal directions uses an input/output switch to switch between two amplifiers (one for TX and one for RX) in the opposite directions. Efficient implementation of the bi-directional amplifier without the input/output switch is feasible but it suffers several design constraints in matching network which limits the gain and the output power of the bi-directional amplifier. Passive phase shifter is a bi-directional implementation in which transmit signal or receive signal can enter from different (input/output) directions. The conventional phase shifter employs multiple stage design with each stage having a high pass path and a low pass path. By switching between the high pass or low pass, different phase shift value can be realized. The issues with passive phase shifter implementation are: 1) Passive structure is lossy and the loss depends on the phase shift value, and needs an additional variable gain amplifier to compensate for the loss; and 2) The area of implementation increases with the number of stages.

A Uni-Directional Vector Modulator (Active Phase Shifter and Variable Gain Amplifier) can be employed to replace the passive phase shifter and variable gain amplifier. The vector modulator uses a 90-degree splitter (coupler), two variable gain amplifiers, and an output summer. By adjusting the gain of two output paths of the 90-degree splitter, a one quadrant vector modulator can be formed. If the polarities of the two variable gain amplifiers can be inverted (180 phase shift), the single quadrant phase shifter is expanded into a 4-quadrant vector modulator (360-degree phase shifter). Note that the size of the vector modulator implementation is independent of the number of phase shifter bits (phase shifter resolution). The phase shifter resolution depends on how the adjustment steps of the variable gain amplifier which can be the similar size regardless how many gain steps available. However, the vector modulator is a uni-directional phase shifter, and both the 90-degree splitter and the passive summer occupy large area. A bi-directional active phase shifter/vector modulator was proposed in U.S. patent application Ser. No. 16/809,499, filed on Mar. 4, 2020, the subject matter of which is incorporated herein by reference. While such invention achieves the desired operation but has limited bandwidth and frequency tunability.

A receive phased-array antenna includes a combiner network, which can be formed by multiple combiners arranged in a hierarchical configuration or alternatively a serially coupled configuration. Similarly, a transmit phased-array antenna includes a divider network, which is formed by multiple dividers arranged in a hierarchical configuration or alternatively a serially coupled configuration. A passive divider network is structurally the same as a combiner network. A TDD Phased-Array Antenna includes a bi-directional variable gain amplifier and a bidirectional combiner and splitter in addition to phase shifter as processing elements. Conventional realization of amplification in both TX and RX directions uses an input/output switch and two amplifiers. Efficient implementation of the bi-directional amplifier without the input/output switch is feasible but it suffers several design constraints in matching network which limits the gain and the output power of the bi-directional amplifier. Conventional passive combiner and splitter implementation are Wilkinson or Rat Race or others. Such implementation suffers from large area, loss, and limited bandwidth. It is a more compact design approach to employ active combining and dividing approach in conjunction with active vector modulator for the phased-array processing. An active combiner and divider already include the variable gain amplifier.

A solution is sought to improve the frequency tunability of the design of the bi-directional active phase shifter/vector modulator and active combining and dividing.

SUMMARY

A novel frequency tunable bi-directional phased-array processing which provides the variable phase shifting and amplitude adjustment, equal or unequal combining, and splitting is proposed. The proposed frequency tunable phased-array processing is accomplished via a frequency tunable bi-directional vector modulator and active combining and dividing. The advantages of the frequency tunable bi-directional active phased-array processing include: 1) Compact size—employing active current combining technique, short transmission lines are used to perform signal combining rather than using area-consuming Wilkinson combiner or splitter; 2) High phase and amplitude resolution and flexibility—phase interpolation can be performed by vector addition through m-path vector modulators; 3) High efficiency—no signal switch loss, only switched matching impedance; 4) Simplified signal interconnection—no need to have separate TX and RX interconnection; 5) No passive combiner needed—eliminate large size and losses in the passive combiner); 6) Can provides both equal or unequal active combining and/or dividing, which is difficult to realize with passive combining and/or splitting network; and 7) Can combine and divide different signals; 8) allows operation at different center frequencies with a wide frequency band or switching to a different frequency band.

In one embodiment, a frequency tunable BD vector modulator receives an input signal by a frequency tunable quadrature phase coupler coupled to two first matching networks (MN1s). The frequency tunable quadrature phase coupler with configurable tuning element(s) for different frequencies, converts the input signal into an I signal and a Q signal. The BD vector modulator amplifies the I signal by a first gain value using a first frequency tunable bi-directional variable gain differential complementary transistor core (BD-VGA). The first BD-VGA outputs an I' signal onto a common node. The frequency tunable BD vector modulator amplifies the Q signal by a second gain value using a second BD-VGA. The second BD-VGA outputs a Q' signal onto the common node. The frequency tunable BD vector modulator performs active current summing or current sharing at the common node. The common node is coupled to a shared second matching network (MN2) for outputting an output signal. The first and the second BD-VGAs share the same MN2, and the BD vector modulator has adjustable input impedance matching circuit and output impedance matching that allow the BD-VGAs to match to the input or output matching networks for both signal directions.

In one embodiment, the variable active combining and dividing are accomplished by sharing the second matching network (MN2) at the common node of the multiple BD vector modulators and the current combining or sharing of signals from multiple BD vector modulators. In another embodiment of the variable active combining and dividing, an additional bi-directional variable amplifier is added to the output of the BD vector modulator for performing the variable active combining and dividing. All bi-directional variable amplifiers (either with or without output matching networks) from multiple BD vector modulators shares a common node and an impedance transformer where the current combining and sharing are accomplished. The impedance transformer provides a low impedance interface suitable for current combining from or current dividing into the multiple vector modulators.

Other embodiments and advantages are described in the detailed description below. This summary does not purport to define the invention. The invention is defined by the claims.

BRIEF DESCRIPTION OF THE DRAWINGS

FIG. 3B illustrates embodiments of gain steps and realizing high resolution phase shifting.

DETAILED DESCRIPTION

Reference will now be made in detail to some embodiments of the invention, examples of which are illustrated in the accompanying drawings.

Figure 1:
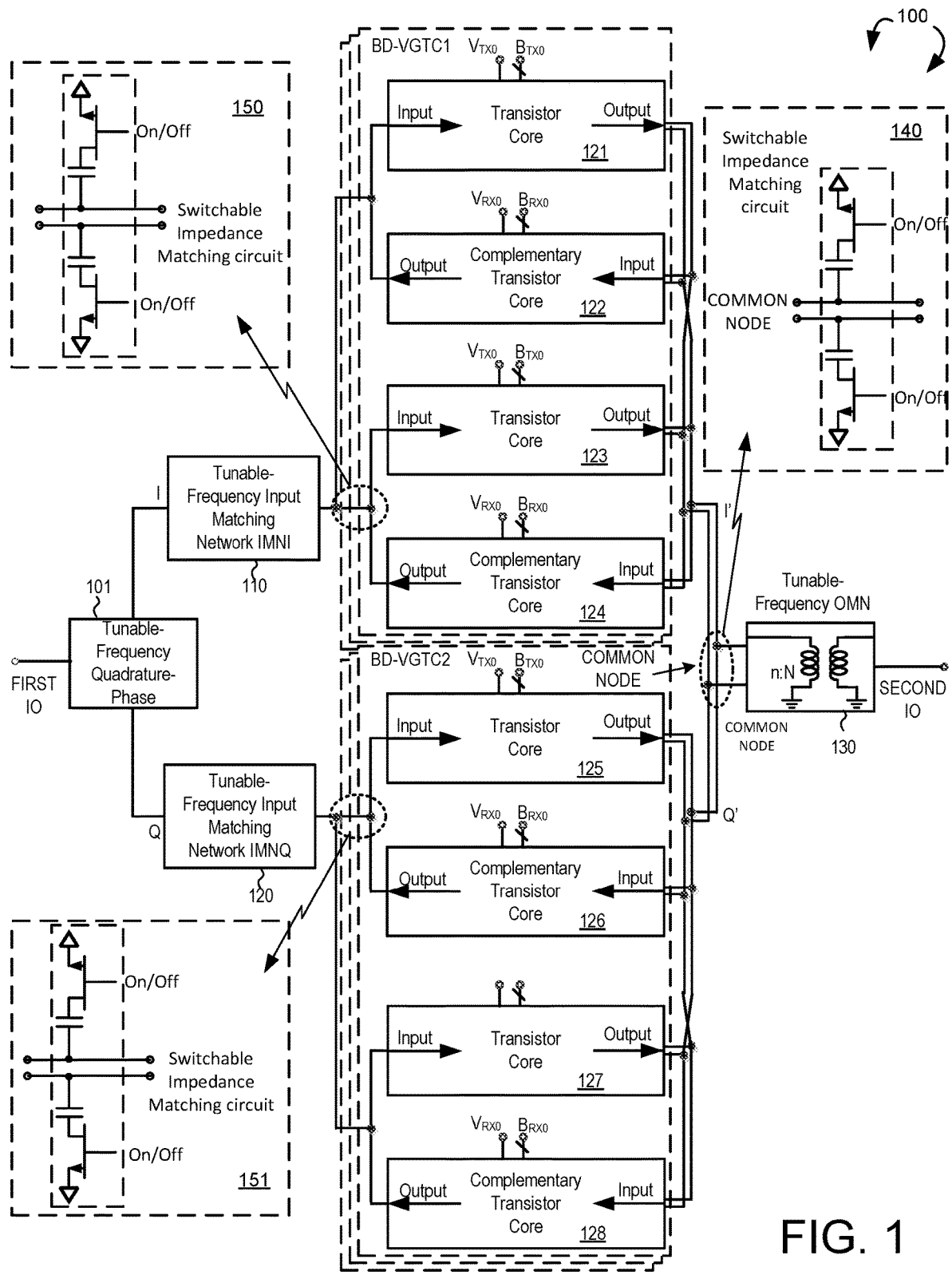
FIG. 1 is a simplified block diagram of a frequency tunable bi-directional vector modulator (active phase shifter) with active output combiner in accordance with one novel aspect.

FIG. 1 is a simplified block diagram of a frequency tunable bi-directional vector modulator (active phase shifter) 100 with an active common node combiner/splitter in accordance with one novel aspect. The frequency tunable bi-directional vector modulator 100 comprises a frequency tunable Quadrature-Phase coupler 101 coupled to a first input terminal for receiving signals, two frequency tunable I and Q input matching networks (IMNI 110 and IMNQ 120), a number of I path bi-directional variable gain transistor cores (BD-VGTC1s), a number of Q path bi-directional variable gain transistor cores (BD-VGTC2), and one shared output matching network (OMN 130) coupled to a second output terminal for transmitting signals. Control signals ($V_{TX0}$ and $V_{RX0}$) are used to select either transmitter or receiver mode signal flow direction, and control signals ($B_{TX0}$ and $B_{RX0}$) are used to assign different gain levels for the variable gain transistor cores. Note that the bi-directional vector modulator 100 can operate in both signal flow directions, e.g., the first input terminal and IMNs 110 and 120 can become output terminal and the second output terminal and OMN 130 can become input terminal and IMN, respectively, for the reverse signal flow direction.

If the input signal enters through the Quadrature-Phase coupler 101 (from the left side), the input signal is split into I and Q signals, resulting in a 90-degree phase shift between the I and Q signals. In the I signal path, the bi-directional variable gain amplifier consists of a number of BD-VGTC1s, each BD-VGTC1 is capable of bi-directional and gain adjustment operation of a pre-determined gain step value, which together allow amplitude of the I signal to be adjusted within a range of gain steps. In the Q signal path, the bi-directional variable gain amplifier consists of a number of BD-VGTC2s, each BD-VGTC2 is capable of bi-directional and gain adjustment operation of a pre-determined gain step value, which together allow amplitude of the Q signal to be adjusted within a range of gain steps. The resultant I' and Q' signals are actively summed to achieve any signal phase shift within a quadrant. Such operation forms a single quadrant vector modulator which covers the phase shifting from zero to 90 degrees. If the polarity in each of the I and Q signals can be inverted independently along the I and Q signal paths, the phase shifting can cover four quadrants (zero to 360-degrees). The complementary configuration of the differential transistor cores 121 and 122, performs the bi-directional amplification in which only one differential transistor core is active (for signal enters from the left, 121 is active), depending on the signal direction. Similarly, the complementary configuration of the differential transistor cores 123 and 124, performs the bi-directional amplification in which only one differential transistor core is active (for signal enters from the left, 123 is active), depending on the signal direction. At the common node, the connection of the first pair of complementary differential transistor cores 121 and 122 is reverse relative to the second pair of complementary differential transistor cores 123 and 123. By selecting either the first pair or second pair of the complementary differential transistor cores, current summing or current subtraction is performed, resulting in either a positive or negative gain step of pre-determined value.

If the input signal enters from the active summing (the right) side, it is necessary to change the current summer into a current divider under the control of $V_{TX0}$ and $V_{RX0}$ which indicates the signal flow direction (enters from right side or left side) and either one of the second or the fourth transistor core (122 and 124) from the top of the BD-VGTC1 is turned on, depending on if it is a positive or negative gain step and first and the third transistor core (121 and 123) are turned off. Similarly, for the input signal enters from the active summing (the right side), either the second or the fourth transistor core (126 and 128) from the top of the BD-VGTC2 is turned on, depending on if it is a positive or negative gain step and first and the third transistor core (125 and 127) are turned off. The input signal enters from the right side is divided into two equal phase signals which go through the two BD-VGTCs before they are combined through the Quadrature-Phase coupler 101.

It should be noted that if I and Q branch BD-VGTCs both increase or decrease the gain by the same amount, the vector modulator, does not alter the signal phase, but provides the signal amplitude scaling function. The amplitude scaling is needed in the phased array operation for shaping the forming of a pre-determined antenna beam pattern. Thus, it should be noted that the proposed invention provides both the variable amplitude and phase (VAP) function.

It is important that the I input matching network 110 to be impedance matched to the left node of the BD-VGTC1s and Q input matching network 111 to be impedance matched to the left node of the BD-VGTC2s, for all the phase shifting and amplitude adjustments. It is equally important that the output matching network 130 to be impedance matched to the common node (right side) of the BD-VGTC1s and BD-VGTC2s.

FIG. 1 further illustrates an embodiment of the optional switchable impedance matching circuits 140, 150, 151. When signal amplification direction is changed, the switchable impedance matching circuits 140 are incorporated to achieve input and output impedance matching in the preferred embodiment. The key idea is to adjust the output impedance of the BD-VGTC1s and BD-VGTC2s using 140 to match the output matching network 130 when the signal enters from the left side. When the signal enters from the left, the two IMNs 110, and 120 connect to the gate of the transistors 121, 123 and 125, 127, respectively and a large transistor input capacitance can be expected at the IMNs. In contrast, the OMN (130) is connected to the output of the transistors 121, 123, 125, 127 and a small capacitance can be expected without the switchable impedance matching network. To compensate this, the switchable impedance matching circuit 140 at the right side of the transistor core is switched on (switch closed) to increase the output capacitance when signal enters from the left. Conversely, the switchable impedance matching circuit 140 at the right side of the transistor core is switched off (switch open) when the signal is enters from the right. Similarly, the two I and Q switchable impedance matching circuits 150 and 151 can be added to the left side of BD-VGTC1s and BD_VGTC2s. When signal enters from the right, the switchable impedance circuits 150 and 151 are switched on (switch closed) and when signal enters from the left and 150 and 151 are switched off (switch open). In a preferred embodiment, each BD_VGTC connects to the switchable impedance matching circuits (loads) to achieve identical input and output impedance in both switched amplifier directions. The two matching networks (IMNs and OMN) connected to the opposite sides of the two BD-VGTCs does not change with the signal direction, which requires the two BD-VGTCs to have the identical impedance in either amplifier direction with the aid of switch impedance matching circuits.

The novel active bi-directional vector modulator 100 can be used to create a combined high-resolution phase shifter and variable gain amplifier. Traditionally, a vector modulator uses a 90-degree splitter, two variable gain amplifiers, and a passive output summer. Such traditional vector modulator is a one directional phase shifter, and both 90-degree splitter and passive summer occupy large area. The novel vector modulator 100 replaces two variable gain amplifiers and the passive output summer with an active combiner which uses current combining technique to sum up the output current from two the variable gain transistor cores BD-VGTC1 and BD-VGTC2 (with invertible polarity). The two variable gain complementary transistor cores BD-VGTC1 and BD-VGTC2 adjust the output currents to achieve variable gain, and thereby achieving the amplitude and phase shifting of four quadrants (360-degree phase shift). As depicted in FIG. 1, active amplifier summing circuit 130 occurs at the common node, which sums the output currents of the BD-VGTC1s and BD-VGTC2s, and uses a shared output matching of OMN 130. Since only one output matching network (e.g., OMN 130) is used, the implementation is simplified with reduced IC area.

The output current combining (signal enters from the left) or input current splitting (signal enter from the right) mechanism may be realized by two ways. First, the complementary transistor cores in each BD_VGTC provides the input to output isolation and controllable current source. Second, an output matching network (e.g., OMN, preferred to be a differential transformer coil), is placed at the right node as a matching component and the amplifier load for two BD_VGTCs. Using the switch impedance matching in both side of the BD-VGTCs, the condition for achieving impedance match of active combining or splitting is met where the (input) left node impedance of each of the BD-VGTC maintains the same in both signal flow directions, and the (output) right node impedance of each of the BD-VGTC maintains the same in both signal flow directions, implying that the right node impedance of the connected right nodes of BD-VGTCs maintains the same in both signal flow directions.

Figure 2A:
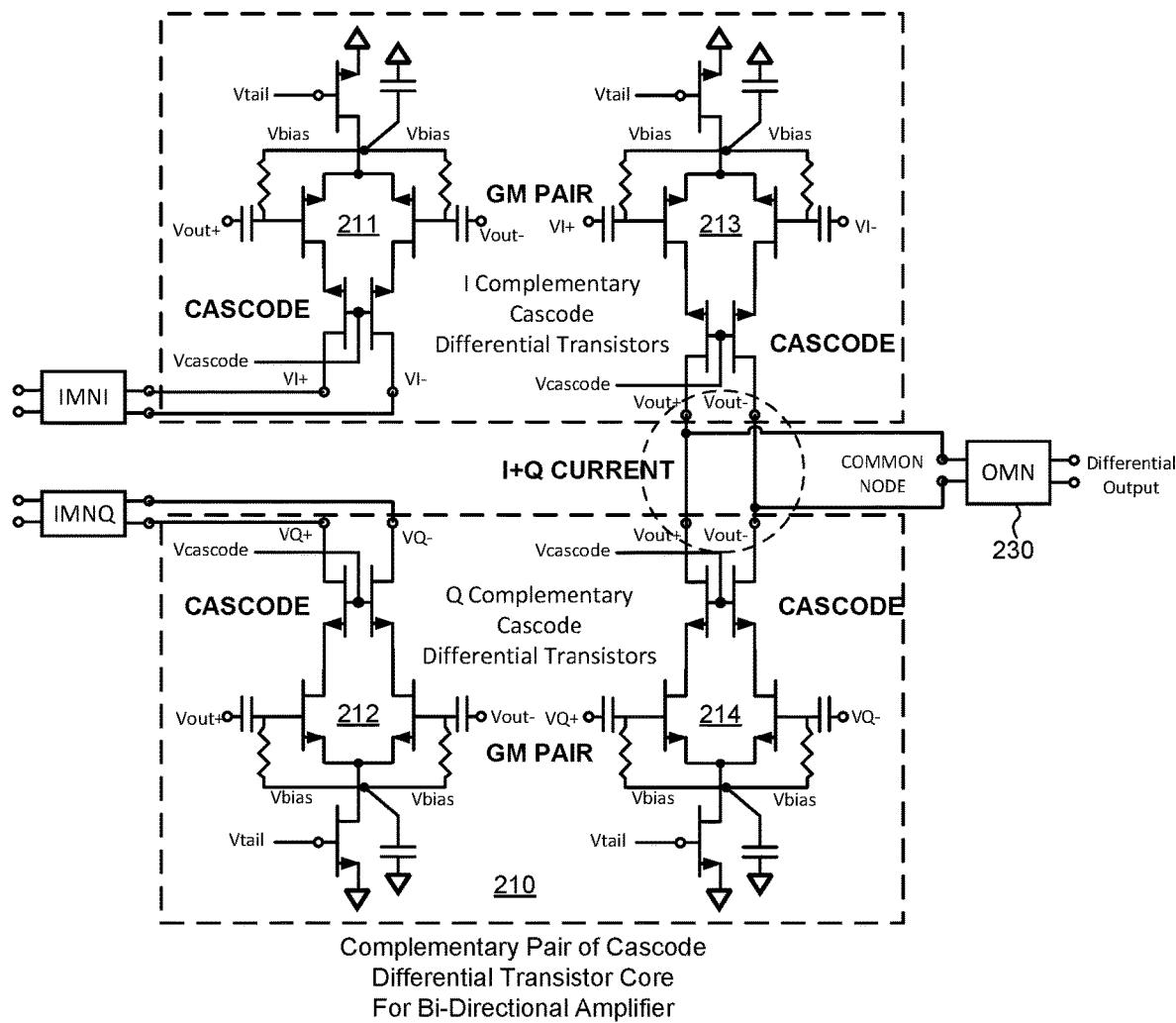
FIG. 2A is a simplified circuit diagram of the architecture of a bi-directional complementary transistor core without shared cascode transistor in accordance with one novel aspect.

FIG. 2A is a first embodiment of a BD_VGTC with a single set of complementary differential transistor cores (211, 212 and 213, 214) for I and Q paths with configuration 210 to illustrate how to achieve bi-directionality (the gain/phase shifting mechanism are included here for simplicity). The differential input (transistor gates) of the first I path differential transistor core 213 and the differential input (transistor gates) of the first Q path differential transistor core 214 is connected to IMNI and IMNQ, respectively, whereas the differential output (transistor drains) of the second I differential transistor core 211 is connected to IMNI and the differential output (transistor drains) of the second Q differential transistor core 212 is connected to IMNQ, respectively. Both the differential outputs (transistor drains) of the first I and Q differential transistor cores (213 and 214) are connected to OMN whereas both the differential inputs (transistor gates) of the second I and Q differential transistor cores (211 and 212) are connected to IMNI and IMNQ, respectively. When the signal enters from the left, only the differential transistor cores 213 and 214 are turned on by the control signal, the differential transistor cores 211 and 212 are turned off. When the signal enters from the right, only the differential transistor cores 211 and 212 are turned on by the control signal, the differential transistor cores 213 and 214 are turned off. FIG. 2A illustrates the cascode differential transistor configuration as the preferred embodiment which offer high input and output isolation. Non-cascode differential configuration can also be used as an alternate embodiment. Also, single-ended amplifier configuration instead of differential amplifier configuration can be used as well.

Figure 2B:
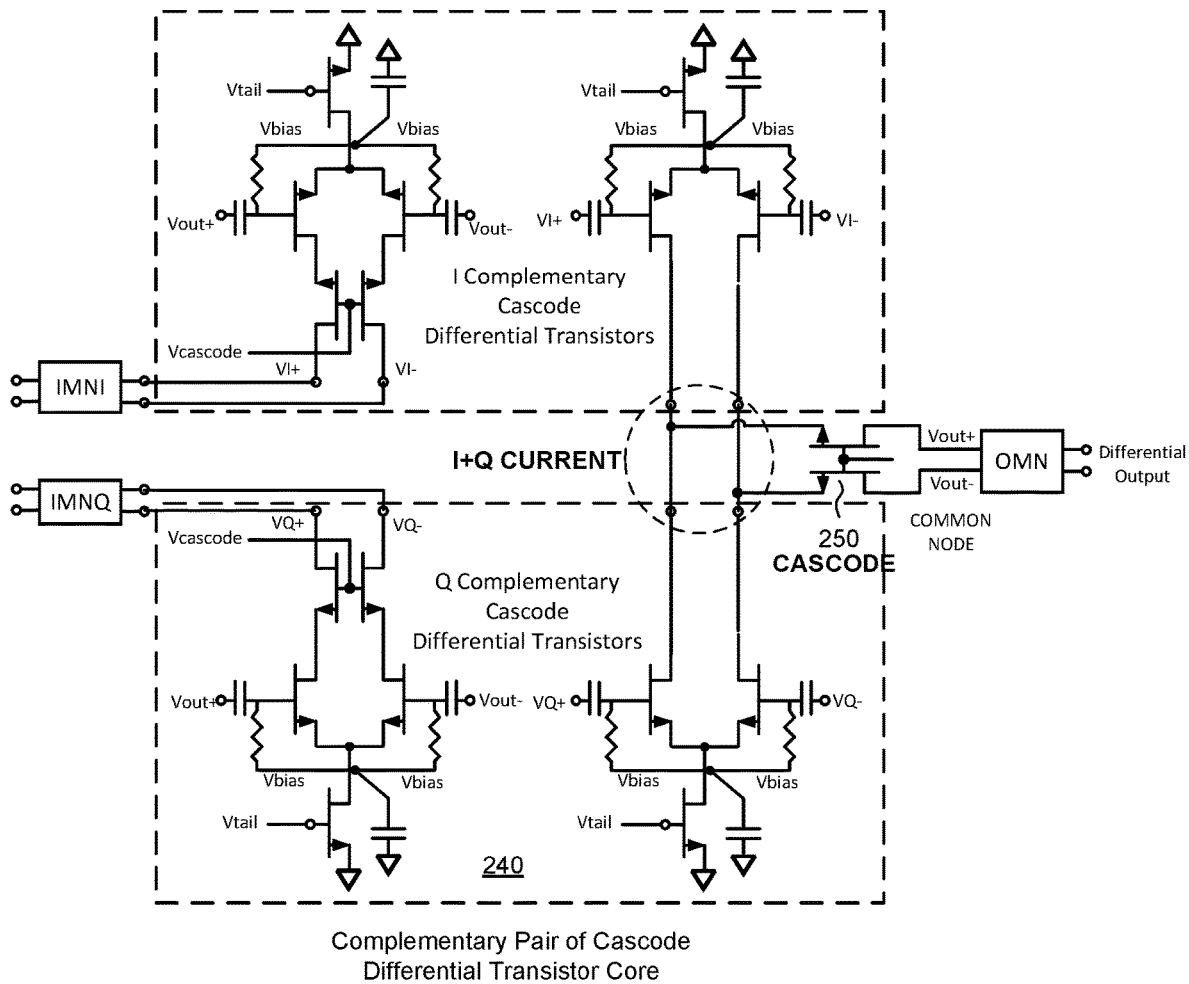
FIG. 2B is a simplified circuit diagram of the architecture of a bi-directional complementary transistor core with shared cascode transistor in accordance with one novel aspect.

FIG. 2B shows a second embodiment of the I path and Q path complementary differential transistor cores with configuration 240, in which the cascode transistors 250 at the common node are shared by the I and Q paths. In this embodiment, the I and Q current summing of this configuration occurs at the source nodes of the cascode transistors 250. Note that sharing of the cascode transistor reduces the parasitic as seen at the common node, improving the impedance matching which is an important factor for the mmWave design.

Figure 3A:
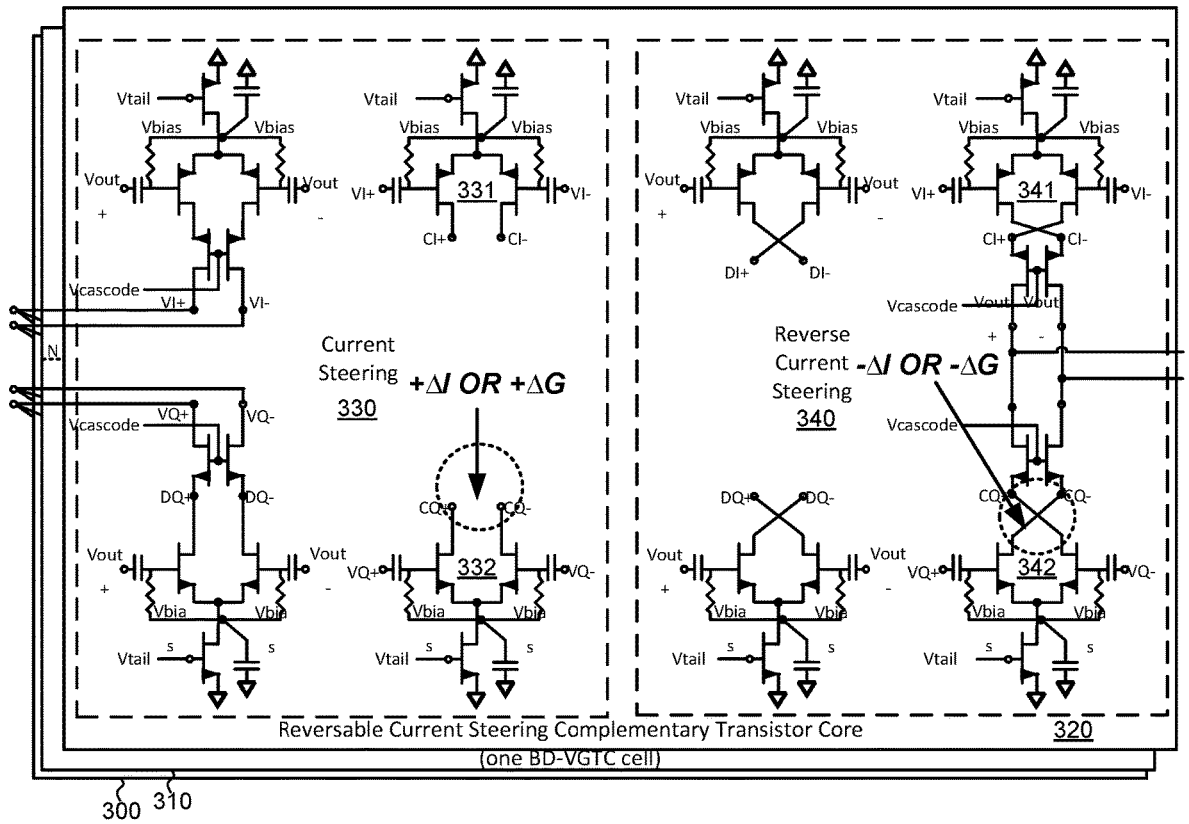
FIG. 3A illustrates a network of parallel connected pair of the reverse and the non-reverse bi-directional complementary transistor core, i.e., a network of parallel BD-VGTC cells for variable gain adjustment, the corresponding phasor diagram and example embodiment.
Figure 3A:
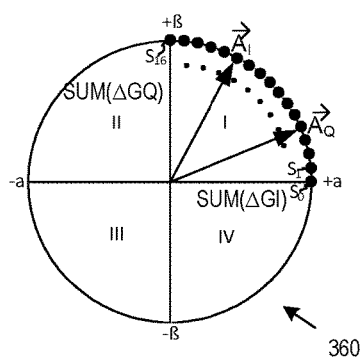
Figure 3A:
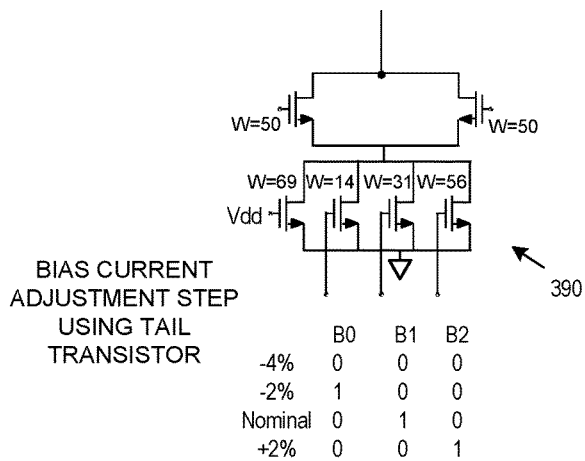

FIG. 3A shows an embodiment of the bi-directional variable gain transistor (transconductance) cores consists of a network of N parallel connected BD-VGTC cells 300, 310 . . . 320, where one BD-VGTC cell consisting of a current steering cell 330 and an identical but reverse direction current steering cell 340, to realize variable amplitude step adjustment or signal polarity reversal. Within one BD-VGTC cell, only one of the non-reverse or reverse current steering 330 or 340 is activated, resulting in current summing (+ΔI or +ΔG) or subtracting (−ΔI or −ΔG). A current step of 2*ΔI can be achieved with one reversable current steering BD-VGTC cell, where the precise amount of current is determined by the transistor width in the transistor core. The variable amplitude adjustment steps are achieved by employing a network of reversable current steering cells (BD_VGTCs) 310 and 300 providing an aggregate summing current of $\Sigma_{k=1}^{N}(\pm)2\Delta I_k$, each reversable current steering cell BD_VGTC has pre-determined transistor width selected for achieving a precise amplitude adjustment step value. The accuracy of the relative amplitude adjustment step is controlled the ratio of the transistor width, which allows precision gain step to be fabricated. In another aspect of this embodiment of FIG. 3A, the signal polarity is determined by the direction of the total combined current from all the reversable current steering cells (i.e., sign$[\Sigma_{k=1}^{N}$ $(\pm)2\Delta I_k]$).

One novel aspect of the proposed invention is that regardless of the either reverse or non-reverse transistor core are activated, the input and output parasitic remains the same. Thus, the parasitic is independent of the amplifier gain setting. This design is called the phase invariant design (the signal phase unchanged since the parasitic is unchanged). Another novel aspect of the proposed invention is that a single cascode transistor can be shared by multiple reversable current steering cells or shared between I and Q transistor cores for reduced (improved) parasitic. Different configurations of sharing or non-sharing of cascode transistors among multiple BD-VGTC cells or I/Q transistor cores are determined by the circuit design. In another novel aspect of the current invention, an additional neutral gain step ($\Delta I$-$\Delta I$) can be obtained by turning on (or off, i.e., $\Delta I$=0) both the reverse and the non-reverse transistor core, resulting in a current adjustment of zero.

FIG. 3A further shows how the phase shifting is achieved as depicted by 360. The signal phase is a combined vector of I and Q channel signals as described by the equation Output=$\alpha \cdot \vec{A}_I + \beta \cdot \vec{A}_Q$ where $\vec{A}_I$ and $\vec{A}_Q$ are the unit vectors of I and Q paths, respectively. The quantity of $\alpha$ and $\beta$ are obtained by the variable gain amplifier setting. The signal amplitude and phase can be written as $$\text{Output} = \sqrt[2]{\alpha^2 + \beta^2} \angle \tan^{-1}\frac{\beta}{\alpha} \text{ where } \sqrt[2]{\alpha^2 + \beta^2}$$

is the amplitude, and $$\angle \tan^{-1}\frac{\beta}{\alpha}$$

is the phase shift. To achieve uniform phase steps, $\alpha$ is selected from [cos(i*$\Delta\theta$), i=0, 1, . . . , 2^(n–2)] and $\beta$ is selected from the corresponding value from [sin(i*$\Delta\theta$), i=0, 1, . . . , 2^(n–2)]. When I and Q path incorporate a polarity invertible mechanism, the phase value from 0 to 360 degree can be achieved. One novel aspect of the proposed invention is that the accuracy of the phase shift depends on the transistor size ratios between I and Q paths, not the absolute transistor size. The accuracy of realized phase shift values is less sensitive to transistor process and operating temperature variations. It should be noted that preferred quadrature-phase vector summing structure proposed can be extended to poly-phase vector summing structure by replacing quadrature phase coupler and I and Q path variable gain amplifiers with a polyphase coupler and x path variable amplifiers (where x equal the number of phases in the polyphase coupler).

For an n-bit phase shifter, the 2^(n–2) gain steps are required for I and Q paths (the first two bits of phase shifting (180 degree and 90 degree) are realized with invertible polarity and the quadrature coupler). Thus, 2^(n–2) parallel BD-VGTC cells are required in each of the I and Q paths. In accordance with one novel aspect of the present invention, the number of parallel BD-VGTC cells can be reduced by employing the technique which turning both the reverse or non-reverse transistor cores on (or off) to achieve a third gain step with one BD-VGTC cell (+$\Delta G$, 0, –$\Delta G$).

FIG. 3B shows an example of a preferred embodiment for a 6-bit phase shifter (370 and 380). A preferred embodiment to provide 2^(n–2) gain steps per quadrant in each of I and Q path is to use synthesis techniques. In theory, minimum number of gain steps is n–2, which can be linearly combined to generate 2^(n–2) steps. However, due to nonlinear nature of the gain steps [cos (i*$\Delta\theta$), i=0, 1, . . . , 2^(n–2)], it generally requires more than n–2 gain steps. A preferred embodiment for realizing high resolution phase shifting is to employ the smallest number BD-VGTCs cores: $G_{m,main}$, $G_{m,0}$, $G_{m,1}$, . . . , $G_{m,p}$, to generate the required gain steps via linear combination:

$$G_{m,total} = G_{m,main} + B_0 \cdot G_{m,0} + B_1 \cdot G_{m,1} \ldots + B_n \cdot G_{m,p},$$

where $B_0$, $B_1$, . . . , $B_n$ are either the value of –1, or 1. $G_{m,main}$, $G_{m,0}$, $G_{m,1}$, . . . , $G_{m,p-1}$, $G_{m,p}$ are transconductance of BD-VGTCs $T_{main}$, $T_0$, $T_1$, . . . , $T_{p-1}$, $T_p$. The objective is to reduce the value p, the number of different BD-VGTCs to achieve the desired nonlinear step size [cos(i*$\Delta\theta$), i=1, . . . , 2^(n–2)]. The proposed algorithm is explained here. First $G_{m,0}$, $G_{m,1}$, . . . , $G_{m,p-1}$ are selected from the basis of the binary numerical representation, i.e., $G_{m,0}$=1, $G_{m,1}$=2, $G_{m,2}$=4, . . . , $G_{m,p-1}$=2^(p–2). This allows any values of Gm<2^(p–1) to be produced via linear combination. The largest $G_{m,p}$ is selected through a simple min-max regression optimization algorithm to minimize the errors in [cos(i*$\Delta\theta$), i=1, . . . , 2^(n–2)–1] and, lastly, the $G_{m,main}$ is selected such that the value 0 (i.e. cos(i*$\Delta\theta$), i=2^(n–2)), can also be generated $$0 = G_{m,total} = +G_{m,main} + B_0 \cdot G_{m,0} + B_1 \cdot G_{m,1} \ldots + B_n \cdot G_{m,n}$$

Note that the transconductance values $G_{m,main}$, $G_{m,0}$, $G_{m,1}$, . . . , $G_{m,p}$ are proportional to the transistor sizes $(W/L)_{m,main}$, $(W/L)_{m,0}$, $(W/L)_{m,1}$, . . . , $(W/L)_{m,1}$ where W is the transistor width and L is the channel length and, generally, same channel length is used in all transistors. An example embodiment for 6-bit phase shifter is shown in Table 380 which shows the residual rms phase error is very small (<0.5 degree) using 7 transistor sizes. The phase shift values generated using variable gain BD-VGTCs obtained from the linear combinations of the 6 transistor sizes and the resultant errors are shown in Table 380. The novel approach linear combination of a few basis transistor sizes for the transconductance cores to generate a large number of phase steps significantly reduces the number of BD-VGTCs used in the modulator.

A further increase in the phase shifter resolution can be obtained by the adjustment of bias current (which changes the transconductance Gm of the BDVGTCs, thus the amplifier gain). Typically, the bias current adjustment can change the transconductance Gm in a small range (e.g. +/–1 dB) without affecting the impedance matching. A preferred embodiment of current bias adjustment 390 is shown in FIG. 3A. Note that multiple tail transistors are used to control the current bias in small increment. Circuit 390 shows a three-bit bias control to achieve +/–2%, 0%, –4% bias adjustment. This allows phase shifter to increase 2 extra bits without increasing the number of BD-VGTC cells. It should be noted that the advantages of adjusting the bias current are that it is a DC operation and does not introduce additional parasitic, thus, complicating the impedance matching, into the signal path.

Figure 4:
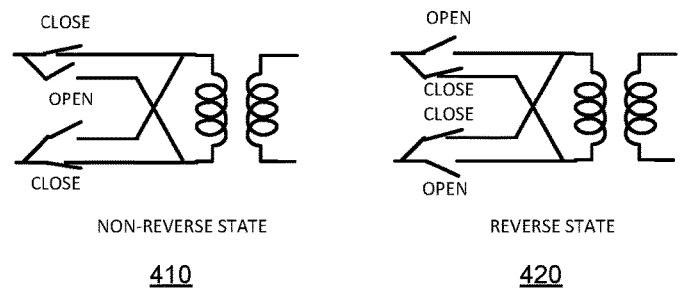
FIG. 4 illustrates different embodiments of a polarity switch.

FIG. 4 is an alternate embodiment for polarity switch is to employ a pair of the single-pole-double throw switch and the differential inductor or transformer to reverse or non-reverse 410, 420 the direction of the current flow in the differential inductor or transformer. Note that if this polarity switch is employed, the BD-VGTCs can contain a main BD-VGTC which only contains a complementary transistor core and does not have a corresponding reverse complementary transistor core as the main amplitude stage, and all other BD-VGTCs are used to adjust the gain of the main BD-VGTC (i.e., $I_{main}+\Sigma_{k=1}^{N-1}(\pm)2\Delta I_k$). In one example, the main BD-VGTC in FIG. 2A or FIG. 2B needs an additional invertible polarity at IMN or OMN.

Figure 5:
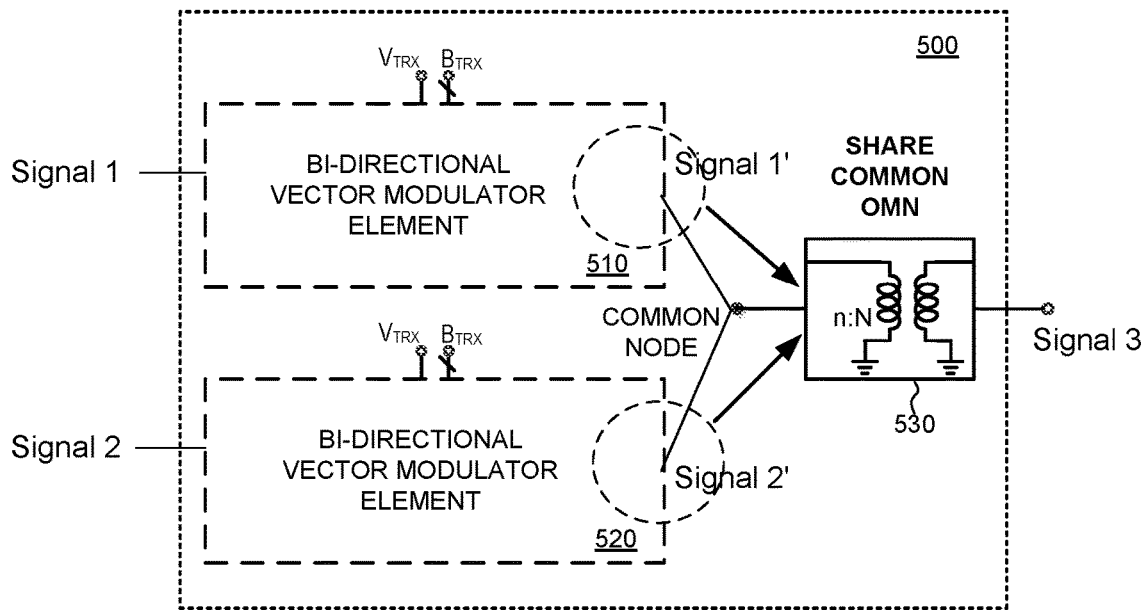
FIG. 5 illustrates a schematic of a first embodiment of a frequency tunable bi-directional phased-array processing apparatus, e.g., an active combiner and/or splitter.
Figure 5:
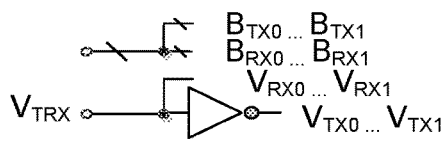

FIG. 5 is an embodiment (Option 1) of an active combiner/splitter 500 in accordance with one novel aspect of the present invention. The active combiner/splitter 500 comprises a first bi-directional vector modulator element 510 and a second bi-directional vector modulator element 520, both coupled to a shared output matching network OMN 530. Each vector modulator element comprises two IMNs and two BD-VGTCs but does not including the OMN as described in FIG. 1. The same shared common OMN 530 is shared by the two bi-directional vector modulator elements 510 and 520, to achieve a further simplification in the circuit. A preferred embodiment of the OMN is a transformer which can transform low impedance to high impedance, a preferred input implementation for the current summing. Control signals ($V_{TX}$ and $V_{RX}$) are used to select either transmitter or receiver mode signal flow direction by activating only one of the two complementary differential transistor core and control signals ($B_{TX}$ and $B_{RX}$) are used to assign phase shift value for each vector modulator element or each phase shifter. In the example of FIG. 5, the first bi-directional vector modulator element 510 performs amplitude and phase adjustment for Signal 1, a second bi-directional vector modulator element 520 performs amplitude and phase adjustment for Signal 2, and the resultant Signal 1' and Signal 2' are summed at OMN 530 and output as Signal 3 with a desired combined result. Note that the amplitude and phase adjustment in Signal 1 and the amplitude and phase adjustment in Signal 2 are independent. The embodiment also works as active splitter. Note that the embodiment in FIG. 5 can suffer from too much parasitic if more nodes (vector modulators) are combined/split.

Figure 6A:
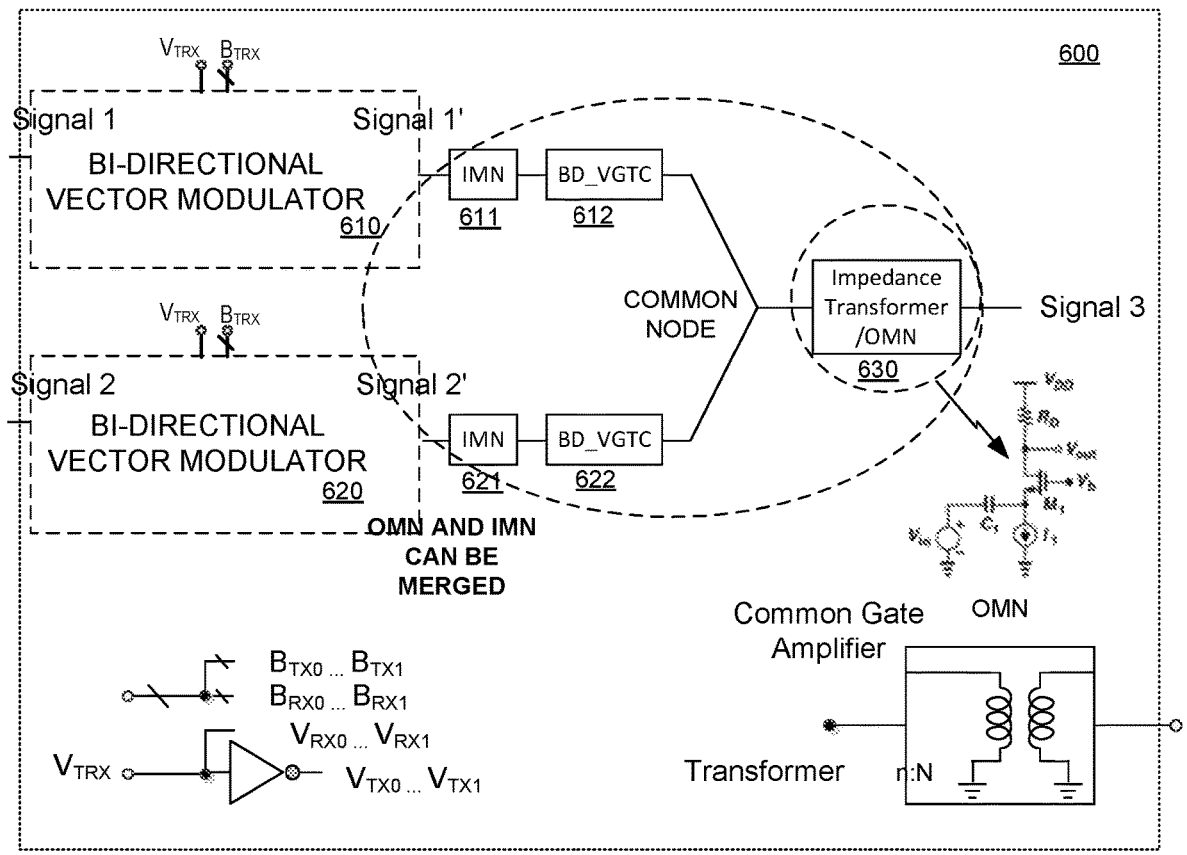
FIG. 6A illustrates a schematic of a second embodiment of an active combiner/splitter.
Figure 6B:
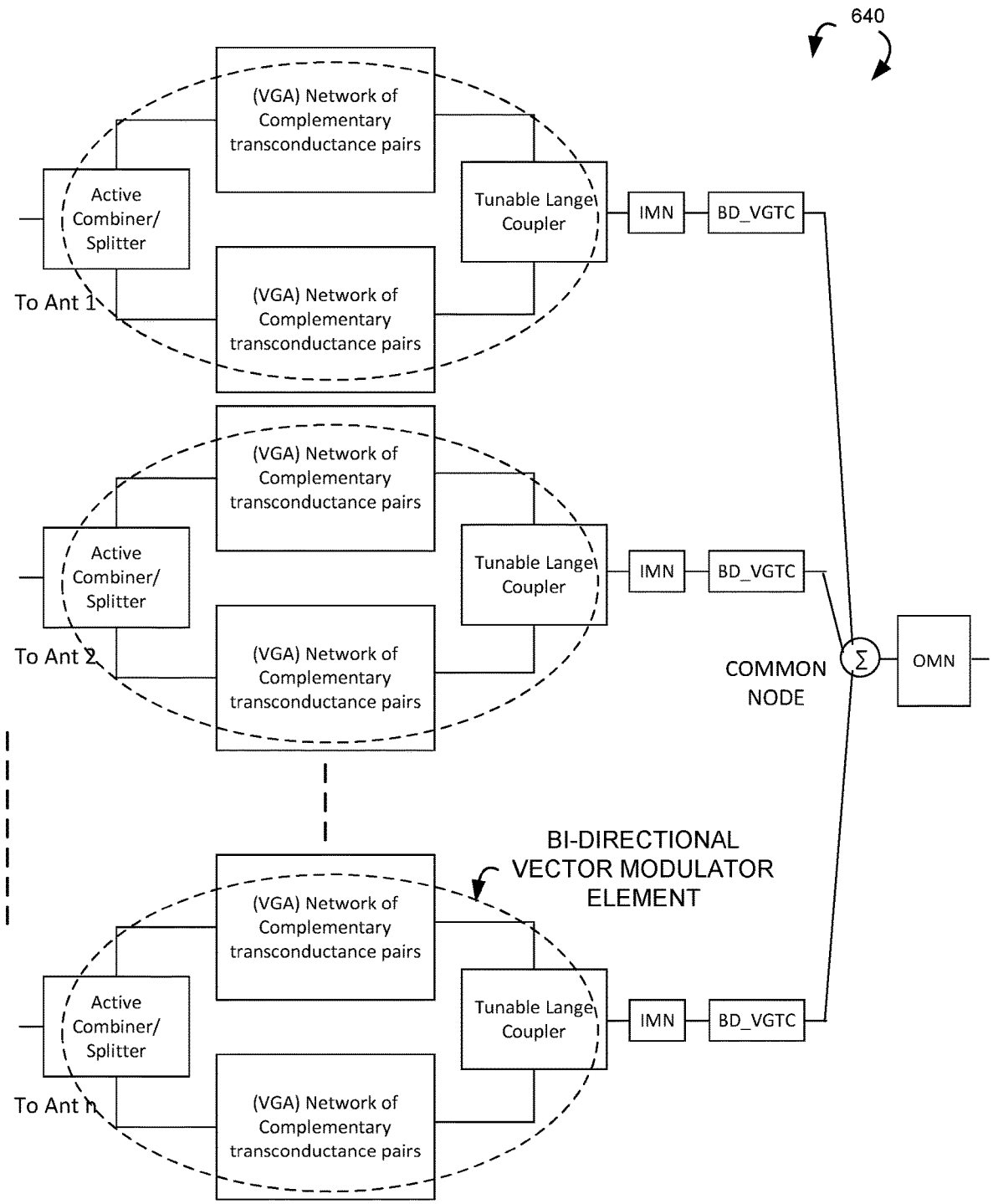
FIG. 6B illustrates a schematic of an alternative option of the second embodiment of the active combiner and/or splitter.

FIG. 6A is an alternate embodiment (Option 2) which can be more easily extended to combine more nodes. A set of IMN 611, 621 and BD_VGTC 612 and 622 are connected to the bi-directional vector modulator 610 and 620. Note that the OMN inside the vector modulator 610 and 620 can be merged with the set of IMN 611 and 621. To achieve the current summing, an impedance transformer 630 is employed to provide a significantly lower impedance for current summing. The preferred embodiment of the impedance transformer is a common gate amplifier or a transformer which provides a low input impedance. The impedance transformer also allows unequal combining operation without being affected by the different gain setting in the two BD_VGTCs 612 and 622. Thus, the current from both BD_VGTCs 612 and 622 can flow to the impedance transformer. The novel bi-directional vector modulator and active combiner and splitter can have m paths to perform phase interpolation or multi-beam application for either transmitter or receiver purpose. The number of m depends on system requirement. An alternate configuration of Option 2 is shown by 640 in FIG. 6B. This alternate configuration flips horizontal the circuit orientation of the vector modulators in which the tunable Lange couplers are now connected to the common node, e.g., the input and output terminals of the vector modulator are flipped as compared to FIG. 6A.

Figure 7:
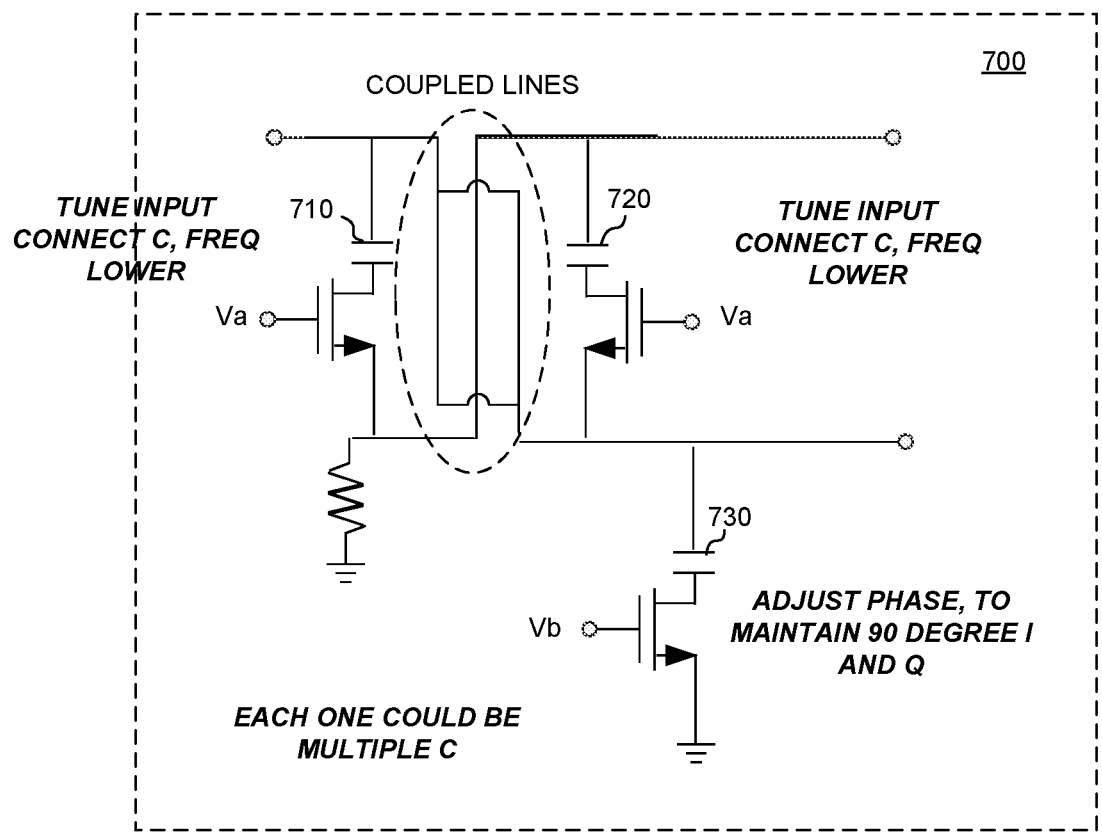
FIG. 7 illustrates a frequency tunable quadrature phase coupler for a vector modulator.

FIG. 7 is a preferred embodiment of a frequency tunable 90-degree Lange coupler 700. The frequency tunable 90-degree Lange coupler 700 can be used as the frequency tunable quadrature phase coupler 101 in FIG. 1. In order to achieve frequency tunability, the first Va switch-capacitor 710 is placed between the input and the isolation port, and the second Va switch-capacitor 720 is placed between the coupled (In-phase, 0°) port and the through (Quadrature-phase, 90°) port, respectively. Furthermore, a third Vb switch-shunt capacitor 730 to ground is placed on either the coupled (In-phase) port or the through (Quadrature-phase) port. The gain balance between the I and Q signals is adjustable by the two Va switch capacitors 710 and 720, while the phase error between the I and Q signals is adjustable by the Vb switch capacitor 730. The Vb switch-capacitor, when closed, adds extra capacitance at the attached port which increases the phase delay of that port. Thus, either through port or coupled port can increase its phase delay to reduce the phase error depending on which branch the Vb switch capacitor 730 is attached to. In the preferred embodiment employing semiconductor integrated circuit, the frequency tunable Lange coupler is realized with two vertical stacked metal layers and a ground metal at bottom. The phase adjustment switched C is placed at upper metal layer farther to the ground metal layer which is typically at a lower metal layer. Reason to place it at upper metal is that: the phase imbalance for vertical coupled Lange coupler comes from the different signal to the ground capacitance of the two stacked metals. The lower metal which is closer to ground suffers stronger signal to ground capacitance. As a result, the signal at lower metal would have more phase delay than at upper metal. The switch-capacitor can compensate this imbalance by increase the capacitance to ground of the upper lower metal. If the input of the frequency tunable Lange coupler is driven at lower metal, then the coupled port at the upper metal includes the switch capacitor to compensate the phase imbalance. If the input of the frequency tunable Lange coupler is driven at upper metal, then the through port at the upper metal includes the switch capacitor to compensate the phase imbalance. In frequency tunable operation, the switch will open at the upper band, and the parasitic of the opened switch can compensate the phase imbalance of the upper band. On the other hand, the switch will be closed at the lower band, and the additional capacitance from the capacitor can compensate the phase imbalance of the lower band.

The Va switch-capacitor adds the capacitance between through and coupled port that could modify the coupling factor of the Lange coupler. By this way, the gain of the through and coupled ports can be modified to balance the gain of the I/Q signal across dual band. In the preferred embodiment, the gain adjustment switched C (Va) is placed between the upper metal and the lower metal to control the coupling factor of the proposed Lange coupler. Reason to place it in this way is that: the gain imbalance for vertical coupled Lange coupler comes from the mismatch of the coupling gain and the through gain. The coupling factor in the preferred embodiment is higher than the coupling factor of the conventional Lange coupler which is 1/sqrt(2). The higher coupling factor can make the coupling gain and the though gain to be equal to each other at the frequency before the quarter-wave resonant frequency. The higher the coupling factor, the lower frequency that occurs the equal coupling gain and though gain, in other word, the lower frequency occurs the good gain imbalance. In frequency tunable operation, the switch is open at the high frequency, which reduces the coupling factor of the proposed Lange coupler and hence achieving good gain balance at the upper band. On the other hand, the switch is closed at the lower frequency, which increase the coupling factor of the Lange coupler, and hence achieving good gain balance at the lower frequency.

Figure 8:
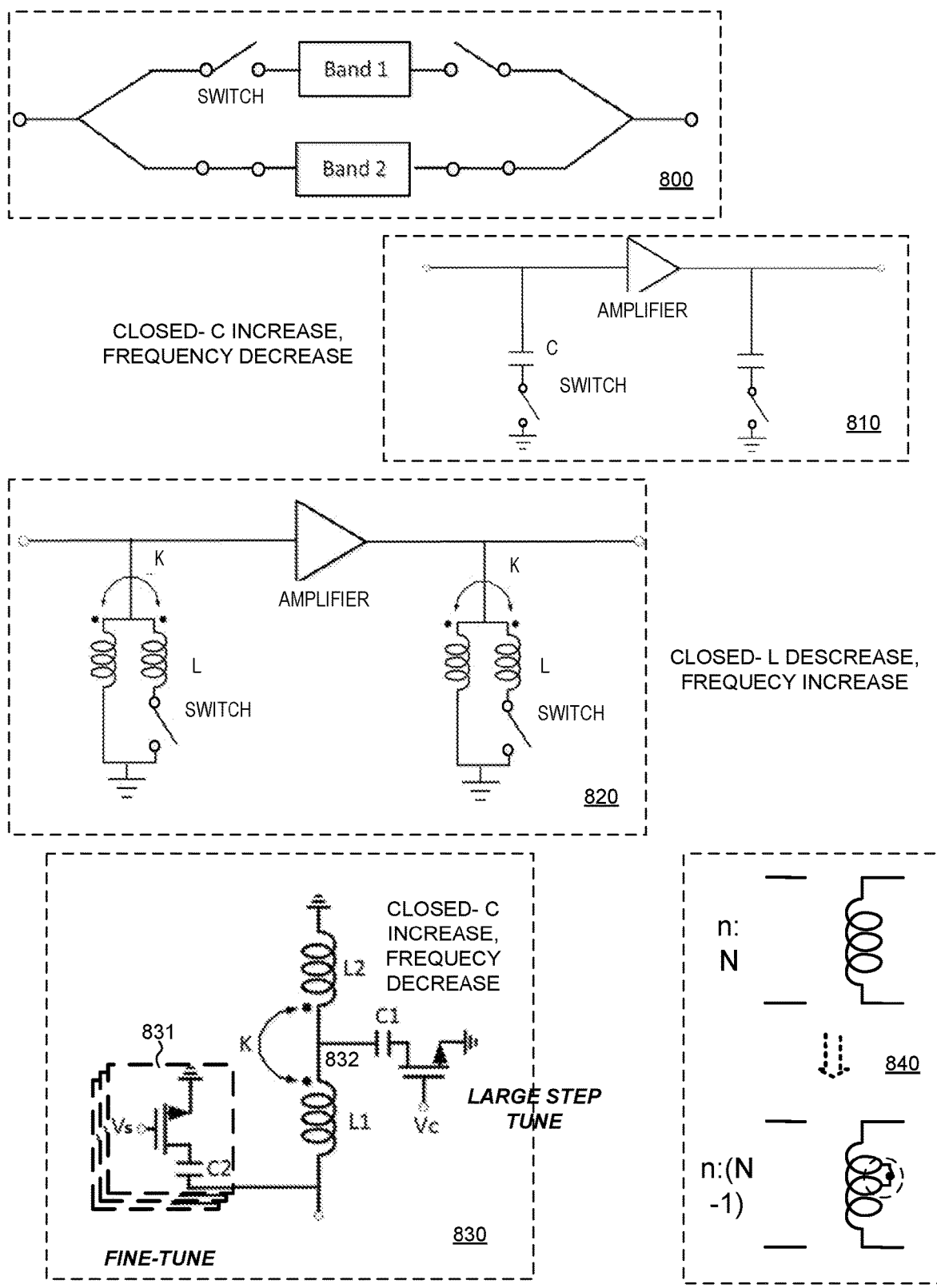
FIG. 8 illustrates multiple embodiments of a frequency tunable matching network.

FIG. 8 illustrates multiple approaches for frequency tuning and band switching. The first approach 800 employs multiple paths, each path is dedicated for a single frequency or band with fixed frequency amplifier/phase shifter tuned to the frequency or band. The drawback is that significant signal loss on the switches and large implementation area is required. The second approach 810 employs a switch capacitor at input and output of an amplifier, since the frequency is proportional to 1/SQRT(L*C), so closed-C increase, then frequency decrease. The second approach 810 suffers from limitation that only limited tunability can be achieved because if the switch capacitor value is too large, the amplifier performance degrades. The third approach 820 employs a switch inductor at the input and output of an amplifier. Closed-L decrease, frequency increase. In the third approach, the switch in series with the inductor degrades the quality factor of the inductor, as a result, degrade the gain of the amplifier.

The preferred embodiment of the switch matching impedance 830 consists of the parallel connection of a network of the shunt switch-capacitors 831 and a series inductor-shunt switch capacitor-series inductor 832. The network of a plurality of the shunt switch-capacitors allows for frequency tuning with a small frequency range. For the large frequency range tuning to a lower frequency, the switch is open, the overall inductance is L1+L2 if k is equal to 0. At higher frequency band, the switch is closed, the overall inductance is close to L1 if k is equal to 0 and the shunt switch C branch becomes the AC ground. The capacitance of C should be designed acting like as short circuit in the interested frequency. The switch is typically implemented with a large transistor size with low on-resistance to reduce the loss of the matching network. The k is the coupling factor of the two inductors. The value of k can be from 0 to 1, allowing an extra degree of freedom in the design. When the switch is closed, the parasitic capacitance of large-size switch can be absorbed into the series capacitor C, resulting in lesser impact to the inductor. If the switch is open, the parasitic capacitance of the switch will create a series L-shunt C- and serial L network, which determines the frequency response of the network at low frequency. Generally speaking, for significant large range of frequency tuning, both the inductance and capacitance should be adjusted. The switch capacitor only for impedance matching only works well for small range frequency tuning. Additionally, the inductor value varies significantly less than the capacitor value in a silicon fabrication, so the proposed invention provides more accurate results. Note that for finer adjustment, a varactor can be used in place of a fixed switch capacitor to allow for smaller incremental adjustment in the capacitance.

Another preferred embodiment is to have switchable ratio transformer 840, which employs a switch to adjust the transformer winding by shorting or parallelizing the windings. It should be noted that only single-ended implementation is shown. For those well-versed in the art, the embodiment can be easily extended from single-ended configuration into differential configuration for use in the differential circuits.

Figure 9:
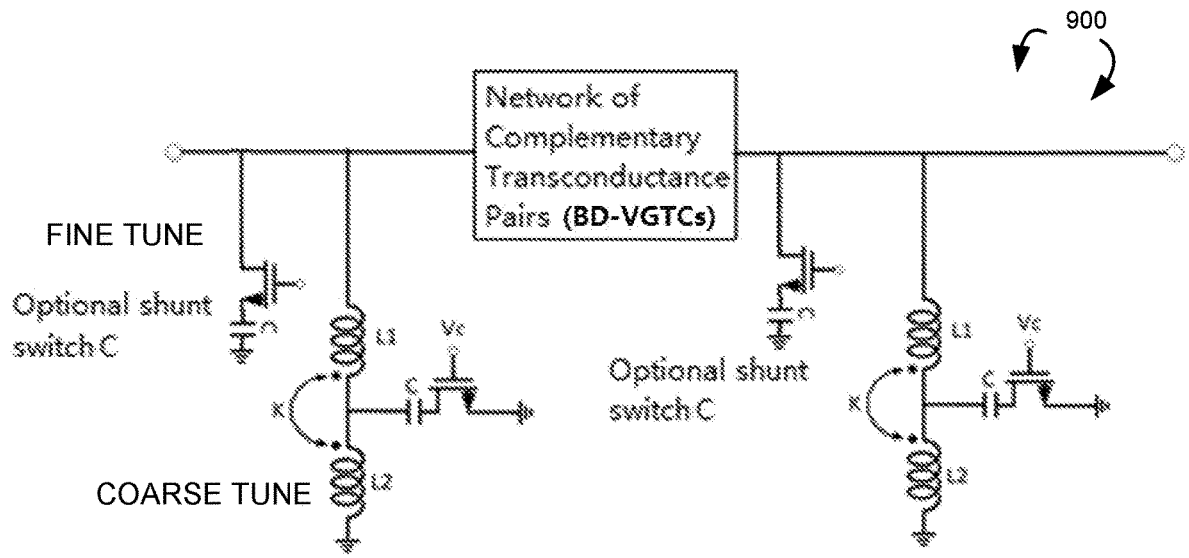
FIG. 9 illustrates an embodiment of a bi-directional frequency tunable amplifier.

FIG. 9 is a preferred embodiment of the frequency tunable BD-VGTC network with input and output switch impedance matching circuits 900. The novel switch impedance matching network provides an optional shunt switch C for the close range frequency tuning and a switch series inductor-shunt capacitor-series inductor for large range frequency tuning, the parasitic in the large switch (with low on resistance) coupling through the capacitor is de-sensed significantly, and overall amplifier efficiency is significantly improved with such configuration at different operating frequencies as discussed in the preceding paragraph.

Figure 10:
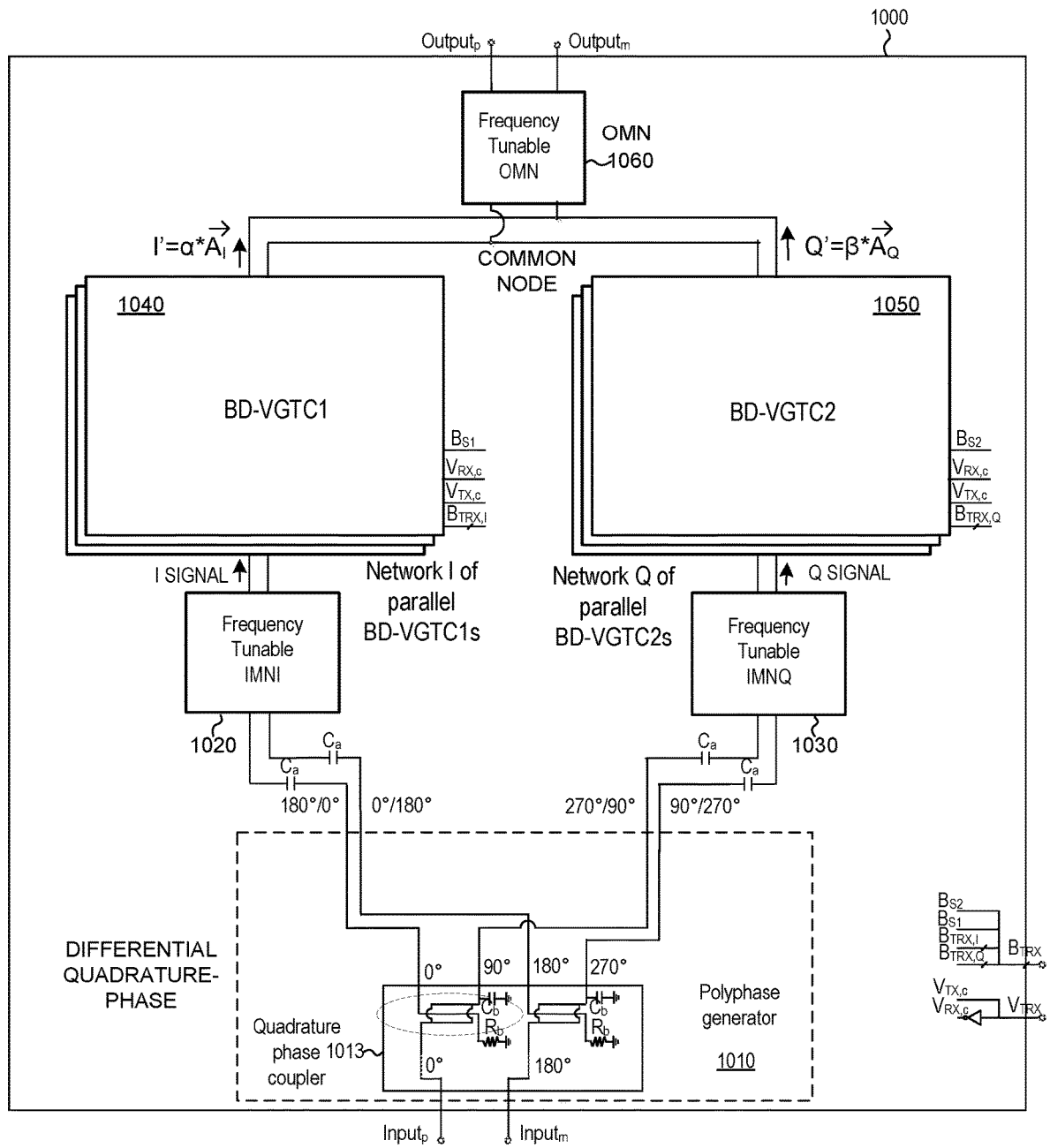
FIG. 10 illustrates an embodiment of a bi-directional vector modulator.

FIG. 10 is the embodiment of the frequency tunable bi-directional vector modulator 1000. Note that the proposed frequency tunable matching circuit block is employed both at the output (OMN side) or both input (IMNI 1020, IMNQ 1030) side and output (OMN 1060) side of the network of parallel BD-VGTCs 1040, 1050. For an embodiment employs the cascode configuration, the current summing of the network of BD-VGTCs 1040, 1050 and I, Q paths can be at the source terminal(s) of the shared cascode transistor(s) or at the output matching network 1060 or the combination of both. For an embodiment employs non-cascode (common source) configuration, the current summing is at the output matching network 1060. The proposed invention achieves the frequency tunable, bi-directional, low loss, phase invariant, high accuracy, high resolution phase shifting and amplitude adjustments with very compact silicon area and with reduced variations over fabrication process (depends on transistor size ratio). Note that the phase polarity switch can be incorporated into BD-VGTCs by reversing overall current direction in the I signal or the Q signal branches.

Another aspect of the present invention is related to the unequal active combining. The input signals from different antennas in the phased-array antenna might not have the same magnitude, due to different antenna positions (antennas at array edge versus antennas at array center), discontinuities in the antenna substrate/ground plane in an array, different types of antenna implementations (end launch dipole antennas versus patch antennas), different signal fading/blockage on different antennas, etc. The signal power levels can differ depending on the array beam direction. Hence, there is needs to dynamically configure unequal combining different on antenna beam direction or environments to achieve the good performance. In the case of receive signals, proper unequal combining of signals from different antennas allow the best signal-to-noise ratio to be achieve. The conventional passive combining using Wilkinson combiners or T-junction do not have the flexibility of changing the combining ratios among the antennas. The novel aspect of the present invention is the capability to scale the signal amplitudes from different antennas using the variable gain active combining.

Figure 11:
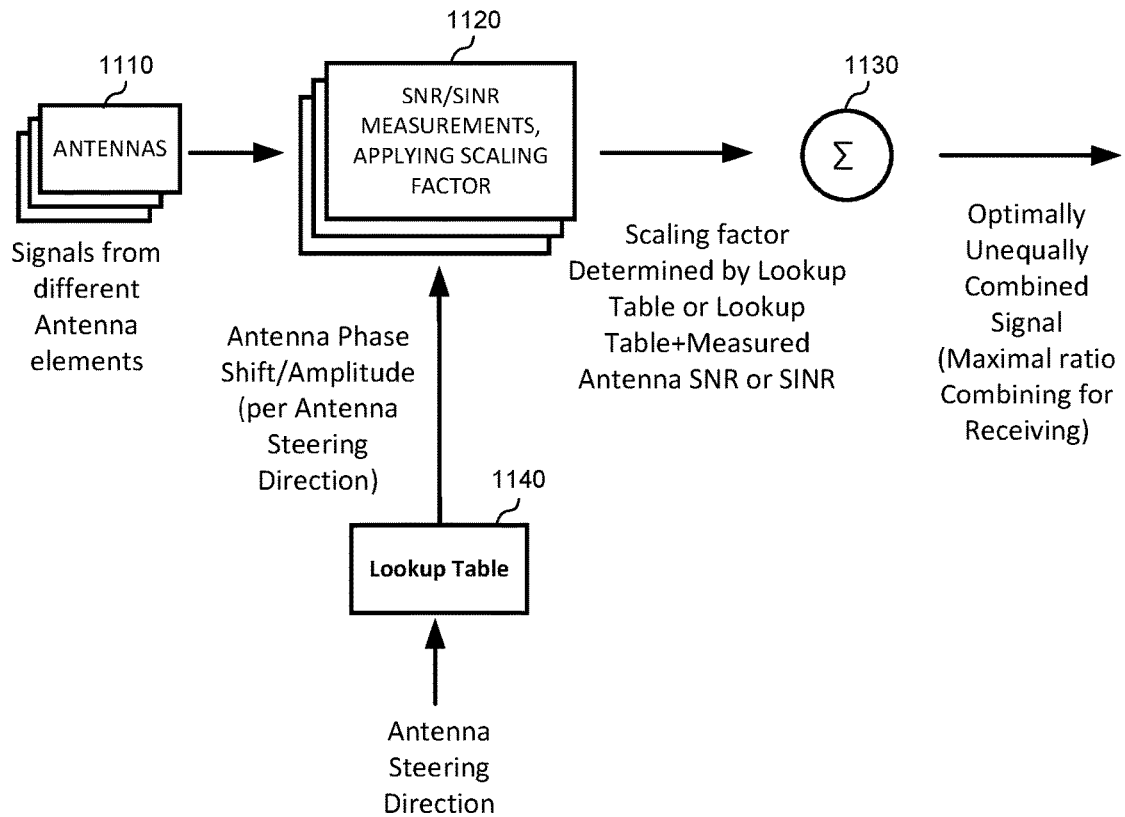
FIG. 11 illustrates an embodiment of an unequal active combiner with optimal scaling.

FIG. 11 is an embodiment of the unequal active combiner in which the variable phase shifting and amplitude adjustment is determined by a pre-determined look up table 1140 or adjusted based on the pre-computed or measured signal-to-noise ratios or pre-computed or detected interfering signals from different antennas (step 1110) to allow optimally combined signals to achieve optimal signal-to-noise ratio or signal-to-noise and interference ratio (step 1130). The scaling factor can be determined by lookup table and the measured antenna SNR/SINR (step 1120). In the specific case of no interference signals, the optimal output SNR improvement in achieved by applying the maximal ratio combining. With interference signal(s), the optimal output SINR is achieved with different criteria. For transmit signal, the signal scaling for different antennas can us pre-determined antenna tapering (such as Taylor tapering) to achieve specific antenna sidelobe or antenna nulling scaling can be applied to suppress signal to certain direction (nulling).

Figure 12:
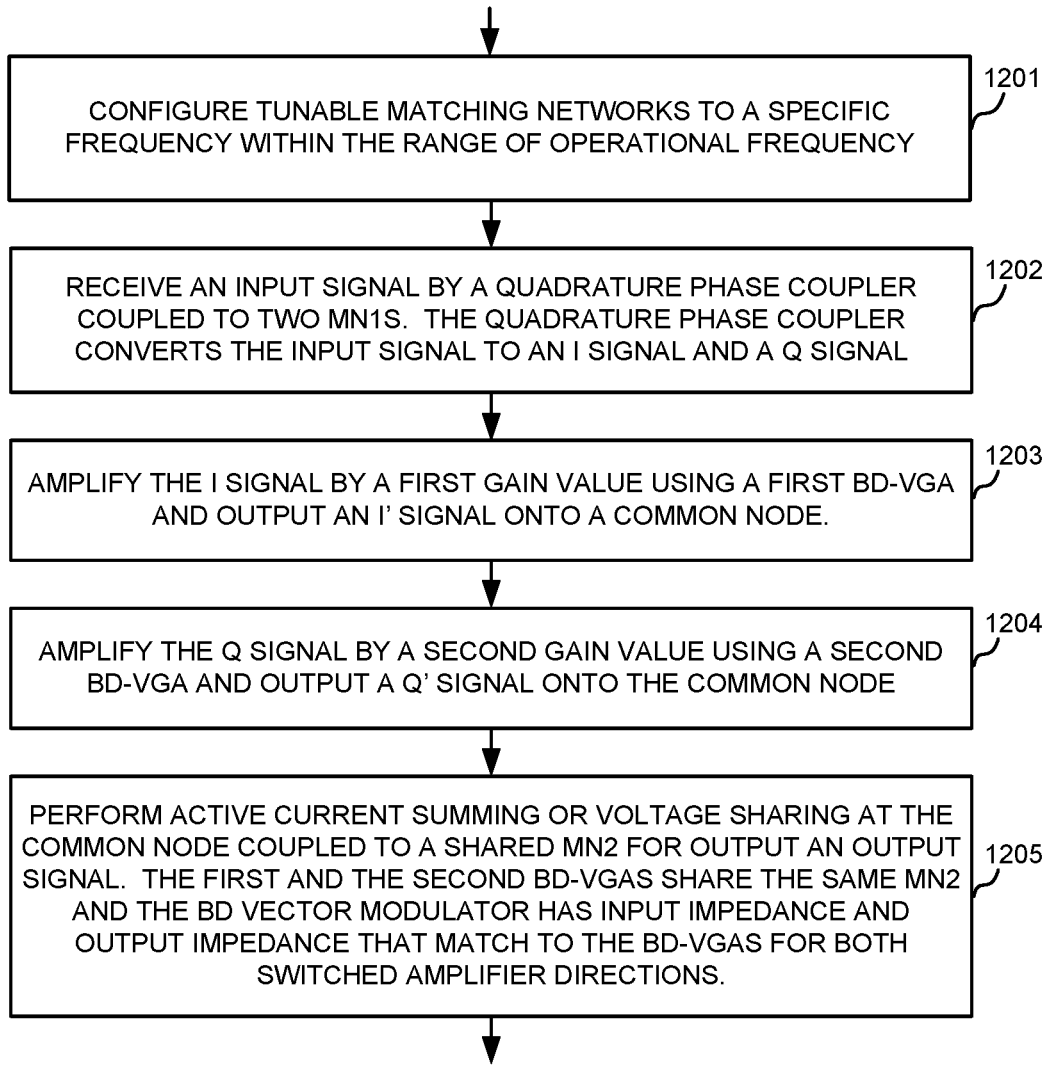
FIG. 12 is a flow chart of a method of a frequency tunable bi-directional phased-array processing consisting of active phase shifter and active combiner and splitter in accordance with one novel aspect.

FIG. 12 is a flow chart of a method of a frequency tunable bi-directional phased-array processing consisting of active phase shifter and active combiner and splitter in accordance with one novel aspect. In step 1201, a BD phased-array processing device configures tunable matching networks to a specific frequency within an operational frequency range. In step 1202, the device receives an antenna input signal by a quadrature phase coupler coupled to two MN1s. The quadrature phase coupler converts the input signal to an I signal and a Q signal. In step 1203, the device amplifies the I signal by a first gain value using a first BD-VGA and outputs an I' signal onto a common node. In step 1204, the device amplifies the Q signal by a second gain value using a second BD-VGA and outputs a Q' signal onto the common node. In step 1205, the device performs active current summing or voltage sharing at the common node coupled to a shared MN2 for outputting an output signal. The first and the second BD-VGAs share the same MN2 and the BD vector modulator has input impedance and output impedance that match to the BD-VGAs for both switched amplifier directions.

Although the present invention has been described in connection with certain specific embodiments for instructional purposes, the present invention is not limited thereto. Accordingly, various modifications, adaptations, and combinations of various features of the described embodiments can be practiced without departing from the scope of the invention as set forth in the claims.

What is claimed is:

1. A frequency tunable bi-directional (BD) vector modulator, comprising: a frequency tunable quadrature phase coupler coupled to a first input-output (IO) terminal and two first matching networks (MN1s), wherein the quadrature phase coupler converts an input signal to an in-phase (I) signal and a quadrature-phase (Q) signal; a first network of parallel bi-directional variable gain transistor cores (BD-VGTCs) that receives the I signal, wherein the first network of BD-VGTCs amplifies the I signal by a first gain value and outputs an amplified in-phase (I') signal onto a common node; a second network of parallel BD-VGTCs that receives the Q signal, wherein the second network of BD-VGTCs amplifies the Q signal by a second gain value and outputs an amplified quadrature-phase (Q') signal onto the common node; and a shared second matching network (MN2) coupled to the common node and a second IO terminal for outputting an output signal, wherein the first network and the second network of BD-VGTCs share the same MN2, and wherein the BD vector modulator has an adjustable input impedance and an adjustable output impedance that match to the BD-VGTCs for both switched amplifier directions.

2. The frequency tunable bi-directional vector modulator of claim 1, wherein the quadrature phase coupler employs a plurality of switch impedance circuits for achieving frequency tuning and maintaining amplitude balance and phase quadrature.

3. The frequency tunable bi-directional vector modulator of claim 1, wherein the networks of parallel BD-VGTCs are combined at the common node with the frequency tunable shared second matching network (MN2).

4. The frequency tunable bi-directional vector modulator of claim 1, wherein the networks of parallel BD-VGTCs share a common cascode transistor between the BD-VGTCs or between the I and Q Paths.

5. The frequency tunable bi-directional vector modulator of claim 1, wherein the networks of parallel BD-VGTCs achieve extra resolution with reversal BD-VGTCs configured in one of reverse, non-reverse, both-on, or both-off states.

6. The frequency tunable bi-directional vector modulator of claim 1, wherein each BDVGTC comprises one or more complementary differential transistor pairs for providing the different phase shift and amplitude adjustment settings.

7. The frequency tunable bi-directional vector modulator of claim 6, wherein the networks of parallel BD-VGTCs achieve extra resolution with adjustable current biasing to control the transistor pairs.

8. The frequency tunable bi-directional vector modulator of claim 1, wherein a number of BDVGTCs used for realizing phase shift values is significantly reduced using a linear combination of a number of basis transistor sizes in the BD-VGTCs.

9. The frequency tunable bi-directional vector modulator of claim 1, wherein a resolution of the vector modulator is increased via a bias current adjustment.

10. The frequency tunable bi-directional vector modulator of claim 1, wherein a signal polarity inversion in the I or Q path is achieved via a switch current direction or a differential polarity switch.

* * * * *